United States Patent [19]

Garone et al.

[11] 4,056,404

[45] Nov. 1, 1977

[54] FLAT TUBULAR SOLAR CELLS AND METHOD OF PRODUCING SAME

[75] Inventors: Lynne C. Garone, Cambridge; Kramadhati Venkata Ravi, Sudbury, both of Mass.

[73] Assignee: Mobil Tyco Solar Energy Corporation, Waltham, Mass.

[21] Appl. No.: 671,610

[22] Filed: Mar. 29, 1976

[51] Int. Cl.² .................................... H01L 31/06
[52] U.S. Cl. ........................ 136/89 PC; 29/572; 136/89 CC; 136/89 SJ; 156/608; 156/DIG. 88
[58] Field of Search .............. 136/89; 29/572; 357/30, 357/55

[56] References Cited

U.S. PATENT DOCUMENTS

| 3,263,101 | 7/1966 | Geer | 310/4 |
| 3,450,568 | 6/1969 | Mann | 136/89 |
| 3,490,950 | 1/1970 | Myer | 136/89 |
| 3,976,508 | 8/1976 | Mlavsky | 136/89 |

Primary Examiner—John H. Mack
Assistant Examiner—Aaron Weisstuch
Attorney, Agent, or Firm—Schiller & Pandiscio

[57] ABSTRACT

The invention provides solar cells in the form of substantially flat oval tubes, i.e. cells having a substantially flat oval ring cross-section.

10 Claims, 8 Drawing Figures

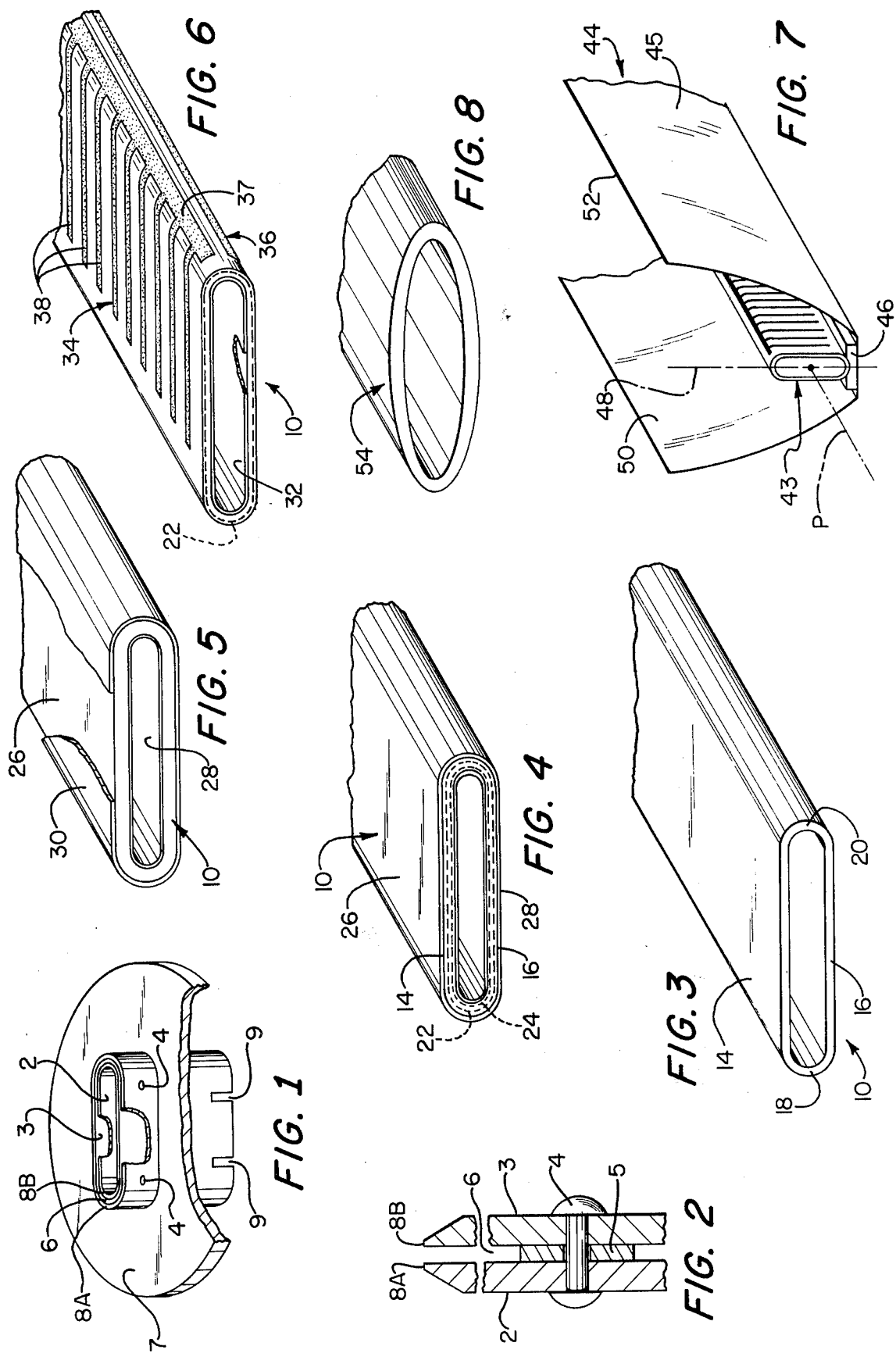

FLAT TUBULAR SOLAR CELLS AND METHOD OF PRODUCING SAME

The present invention relates to the art of converting solar energy into electrical energy and more particularly to improved methods for forming solar cells, and to the resulting solar cells.

At the state of the art prior to this invention, solar cells are most commonly fabricated using semiconductor-grade silicon monocrystals (or other suitable semiconductor materials as known in the art) in substantially flat ribbon form. The silicon ribbons may be provided initially by growing the latter from a melt according to the process disclosed in U.S. Pat. No. 3,591,348 issued to Harold E. LaBelle, Jr. Using the process disclosed by LaBelle, monocrystalline silicon bodies may be grown having controlled and predetermined cross-sectional shapes, e.g. round rods and tubes and flat ribbons, by means of so-called capillary die members which employ capillary action for replenishing the melt consumed by crystal growth. In the process described in U.S. Pat. No. 3,591,348 the crystal is pulled from a thin film of melt which is supported on the upper end surface of a die member that has one or more capillaries for feeding melt to its upper end surface from a reservoir pool so as to automatically replenish the film. The film fully covers the end surface of the die member and, since crystal growth occurs from the full expanse of the film, the growing crystal has a cross-sectional shape substantially corresponding to the end configuration of the upper end surface of the die member. The process disclosed in U.S. Pat. No. 3,591,348 is frequently described as the "EFG" process where the term "EFG" is an abbreviation for "Edge-defined, film-fed growth". Also, by introducing suitable conductivity-type-determining impurities, i.e. dopants, to the melt it is possible to produce bodies by the aforesaid EFG provess which have a P- or N- type conductivity and a predetermined resistivity. The addition of a dopant to a melt from which a crystal is grown is conventional, for example, with Czochralski type processes and also is exemplified by U.S. Pat. Nos. 3,129,061 and 3,394,994.

Silicon ribbons employed in solar cells must be substantially monocrystalline, uniform in size and shape and substantially free of crystal defects. It is not difficult to control the size and shape of substantially monocrystalline ribbons grown by the EFG process. However, one problem which frequently results during the production of flat elongate monocrystals grown from the melt is the formation of defects adjacent the ribbon edges. Although not known for certain, it is believed that such edge defects result from the shape of the liquid/solid interface at the ribbon edges and/or the accumulation adjacent the crystal edges of impurities present in the melt. These edge defects are objectionable and the ribbons must be processed further to remove the defects before they can be used.

Accordingly, the primary object of the present invention is to provide a novel and improved solar cell.

Another object of the present invention is to provide a method which overcomes the aforesaid problems of the prior art, and which method can produce solar cells of improved quality.

Still another object of the present invention is to provide an improved process for producing solar cells using the EFG process.

A further object is to provide a relatively inexpensive and simple method of fabricating solar cells of improved quality.

The foregoing and other objects are achieved in a product aspect by a solar cell which basically comprises a substantially monocrystalline semi-conductor body in the form of a flat oval tube having a pair of opposed mutually spaced relatively large wall sections connected together by a pair of opposed relatively small side edge sections. The tube has a radiation-receiving outer surface and a photo-voltaic junction which is close to the outer surface and is capable of responding to radiant energy passing through the outer surface. Completing the solar cell of the invention are a first electrode which is carried on the tube outer surface and a second electrode which is carried on the tube inner surface. In practicing the process aspect of the invention in connection with producing the novel solar cells, a substantially monocrystalline tubular body of silicon or other suitable semiconductor material which has the shape of a substantially flat oval in cross-section is first formed, e.g. as by the EFG process. A photo-voltaic junction is formed near the outer surface of the flat oval tubular body by suitable semiconductor processing techniques. The electrodes are then formed on the outer and inner flat wall surfaces.

Other features and many of the attendant advantages of this invention are set forth in or rendered obvious by the following detailed description which is to be considered together with the accompanying drawings wherein:

FIG. 1 is a perspective view of one form of EFG die assembly that may be used to form substantially flat tubular bodies as required by this invention;

FIG. 2 is an enlarged fragmentary sectional view of the upper end of the die assembly;

FIG. 3 is a perspective view of a substantially flat tubular body of monocrystalline silicon, FIG. 4 is a perspective view of the same substantially flat tubular body at a first stage of the manufacture of a solar cell unit in accordance with the present invention;

FIG. 5 is a perspective view with a portion broken away of the monocrystalline body of FIG. 3 at another stage of solar cell manufacture;

FIG. 6 is a perspective view with a portion broken away of the monocrystalline body of FIG. 3 at a still further stage of solar cell manufacture;

FIG. 7 is a perspective view with a portion broken away of a preferred form of solar cell constructed in accordance with this invention mounted in a solar collector; and FIG. 8 is a perspective view with a portion broken away showing an alternative form of a substantially flat tubular monocrystalline silicon body at a first stage of the manufacture of a solar cell in accordance with the present invention.

In the several views of the drawing, like numerals refer to like parts.

While the invention may be used to provide tubular bodies of a variety of semi-conductor materials, the following description illustrates the production of solar cells using silicon as the semi-conductor material.

In accordance with a preferred mode of practicing the present invention, a substantially flat oval tubes of a semi-conductor material is provided initially by growing it from the melt using the above-described EFG process. The tube is characterized by having a pair of substantially flat opposed mutually spaced relatively large wall sections connected together by a pair of opposed relatively small curved edge sections. Preferably the tube is of one type conductivity, and the tube is then further treated to form a solar cell. By way of example, the tube may be treated to provide a zone of a second opposite type conductivity with a photo-voltaic rectifying junction created at the interface of such zone and a zone of the first type conductivity. Then electrodes may be applied to the outer surfaces of the relatively large side wall sections and to the tube inner surface to form a solar cell. In an alternative mode of practicing the invention, a substantially flat oval semiconductor tube is provided which is not predominantly of P- or N- type conductivity. In this latter case the tube may then be treated so as to sequentially form contiguous zones of P- type and N-type conductivity which provide a P-N junction that is disposed so as to be capable of photovoltaic behavior in response to solar radiation impinging upon the outer surface of the tube.

Treating the tube so as to create zones of P and/or N type conductivity may be accomplished in various ways known to persons skilled in the art, e.g., by diffusion or ion implantation of a selected dopant or by epitaxial deposition of selected conductivity material. The type of dopant used depends on the material of which the flat oval tubes are composed and also its conductivity type. Thus, for example, boron may be diffused into N-type silicon to produce a zone of P-type conductivity while phosphorous may be diffused into P-type silicon to produce a zone of N-type conductivity. The several types of dopants used for modifying the conductivity of silicon and how such conductivity-modifying impurities may be diffused into a silicon body are well known in the art (see, for example, U.S. Pat. Nos. 3,442,725; 3,162,507; 3,811,954; 3,089,070; 3,015,590; and 3,546,542). The types of dopants required to modify the conductivity type of other materials, e.g. gallium arsenide, cadmium telluride, etc., also are well known to persons skilled in the art. In accordance with prior art knowledge, the concentration of dopants is controlled to obtain the desired resistivity of the P- and N- type regions. For example, for silicon solar cells the resistivity of such regions should be held to less than about 100 ohm-cm and for best coversion efficiency resistivity should be in the range of from about 0.001 to about 10 ohm-cm. Also, in order to improve the efficiency of collecting the photoelectrically produced carriers, the depth of the P-N junction from the surface which is to serve as the radiation receiving surface, should be made small, preferably in the order of ½ micron.

After the P-N junction is formed, the oval tube is then provided with ohmic contacts or electrodes on its inner and outer surfaces, whereby a solar cell unit results which may be connected to an external circuit.

If desired, the resulting solar cells may be coated with a suitable anti-reflection or interference film to reduce reflection losses of solar radiation or to block absorption of infrared radiation.

An example of the preferred mode of practicing the invention will now be described with reference to FIGS. 1-6. While the preferred mode is described in connection with the manufacture of substantially monocrystalline tubes of silicon, it is to be understood that the invention also may be used to produce tubes of other semiconductor materials.

Turning first to FIGS. 1 and 2, there is illustrated an EFG capillary die assembly which comprises two flat oval graphite sleeves 2 and 3 disposed concentrically one inside the other and pinned together by a plurality of transversely extending graphite pins 4. Each pin 4 extends through an annular graphite spacer 5 which serves to maintain the sleeves aligned with a uniform gap 6 between them. The outer sleeve 3 extends through and is attached to a circular plate 7 which is used to mount the die assembly to a crucible in the manner illustrated by LaBelle et al U.S. Pat. No. 3,687,633. The upper ends of sleeves 2 and 3 are preferably bevelled on the inside and outside respectively so as to terminate in flat narrow top end surfaces 8A and 8B respectively, and the gap 6 between the two sleeves is sized so that it can function as a capillary for silicon. One or more slots 9 in the bottom ends of each of the sleeves 2 and 3 assures that melt can flow into the bottom end of the capillary.

Turning now to FIG. 3, a substantially flat oval tube 10 of substantially monocrystalline P-type silicon is provided by growing it from a boron-doped, semiconductor grade silicon melt under an inert atmosphere of argon gas using the above-described EFG process and a graphite die assembly as shown in FIG. 1. The tube is grown in a furnace of the type disclosed by U.S. Pat. No. 3,591,348. A quartz crucible is used to contain the silicon melt and the graphite die assembly is mounted in the crucible in the manner illustrated in said U.S. Pat. No. 3,687,633 so that the silicon melt can enter the bottom end of the capillary and rise to its upper end by capillary action. A silicon seed crystal is used to initiate crystal growth. The sleeves of the die each have a thickness of about 0.040 inch but the corresponding dimension of each of their upper surfaces 8A and 8B is about 0.005 inch while the width of the oval shaped gap 6 between them which serves as the capillary is about 0.015 inch. The tube is grown at a pulling speed of about 2.5 inches per minute. The liquid between the upper end surfaces of the die and the growing solid has a height of about 0.020 inch and at its bottom end its inside and outside dimensions are substantially the same as the corresponding inside and outside dimensions of end surfaces 8A and 8B respectively. However, the width of the liquid is smaller at the liquid/solid interface, as manifested by the fact that the resulting tube 10 has a wall thickness of about 0.006 inch. A more detailed description of the crystal growing process is not believed to be necessary for the purposes of this description since the EFG process and growth of silicon bodies by such process is known to persons skilled in the art, as exemplified by the paper published by T. F. Ciszek, Edge-Defined Film-Fed Growth of Silicon Ribbon, Mat. Res. Bull. Vol. 7(1972), pp. 731–738.

In order to facilitate the subsequent fabrication of tube 10 into a solar cell, it is important that tube 10 have a substantially flat outer surface in major part. Thus, as seen in the drawings, tubular body 10 is formed so that it has a pair of opposed mutually spaced relatively large, substantially flat side wall sections 14 and 16 of substantially uniform thickness which are joined together by a pair of relatively small opposed semi-cylindrical side edge sections 18 and 20. For convenience of illustration, the wall thickness of the tube and the gap between wall sections 14 and 16 are shown somewhat out-of-proportion as being relatively large in relation to the width of wall sections 14 and 16. By way of example, tube 10 may be made with a wall thickness of 0.005–0.010 inch, an overall width (the horizontal dimension in FIG. 3) of about 2 inches, and a gap between the flat, broad side wall sections 14 and 16 of about 0.30 inch. Of course, the tubes may be made with other dimensions and also in other cross-sectional shapes which provide a body having a substantially flat outer surface in major part.

The resulting flat oval tube 10 may then be processed into a solar cell in accordance with per se known techniques. Thus, for example, and in accordance with a preferred method of fabrication, body 10 is introduced into a diffusion furnace where it is exposed to a gaseous mixture of oxygen and phosphorous oxychloride at a temperature of about 1000° C for a period of about 15 to 30 minutes. As a consequence of this diffusion step, phosphorous is diffused into the outer and inner surfaces of the tube so as to form an N-P-N structure with relatively shallow outer and inner N-regions demarcated by dotted lines 22 and 24 and thin layers 26 and 28 of silicon dioxide covering the outer and inner surfaces (see FIG. 4). The N- regions each have a depth of about 0.5 microns and the diffusion oxide layers each have a thickness of about 3000° A. The formation of the diffusion oxide layers is a result of the presence of oxygen which is used as the transport mediuz for the phosphorous oxychloride.

Thereafter as shown in FIG. 5, the tube outer surface is coated with a conventional polymethyl-methacrylate positive resist material as represented at 30 (for convenience of illustration the N- regions 22 and 24 are not specifically demarcated in FIG. 5). Then the tube is immersed first in HF for 1–2 minutes and then in KOH (or a mixture of $HNO_3$ and HF) for about the same amount of time. These immersion steps remove the oxide layer 28 on the unprotected inner surface of the tube and also the inner N-conductivity region demarcated by the line 24. Then trichloroethylene is applied to the tube to dissolve away the resist coating 30 and the tube is again immersed in HF at room temperature long enough (about 2–3 minutes) to remove the oxide layer 26 on the outer surface of the tube but not the outer N-conductivity region 22.

The final step required to make a solar cell is to apply electrodes to the inner and outer surfaces respectively of the tube. The electrodes are formed by a conventional metallization technique. For example, the electrodes may be nickel applied by electroless plating.

In connection with the electrodes, it is to be noted that the tubular structure as hereinabove described may be adapted to provide either of the following: (1) a single solar cell wherein the outer light-receiving surfaces of wall sections 14 and 16 serve as part of the same cell; and (2) two solar cells connected in parallel with the outer surfaces of wall sections 14 and 16 serving as the energy-collecting surfaces of first and second cells respectively. For case (1) and preferably also for case (2), the inner surface of the tubular body is provided with a single electrode 32 which preferably covers substantially the entire expanse of the inner surface. For case (1), the outer surface of the tubular body is formed with a single electrode which covers both of the wall sections 14 and 16 and is wrapped around at least one of the edge sections 18 and 20. For case (2) a separate electrode is formed on the outer surface of each of the wall sections 14 and 16. However, each outer electrode is preferably formed as a grid (e.g., in the manner disclosed by U.S. Pat. Nos. 3,686,036 and 3,811,954) so that a major portion of the tube outer surface is uncovered and thus exposed to receive solar radiation.

FIG. 6 illustrate a preferred mode of electrode arrangement. In this case the outer surface of tube 10 is formed as a pair of grid-like electrodes 34 and 36 disposed on the outer surfaces of the relatively large, substantially flat side wall sections 14 and 16 respectively. Each of those outer electrodes has a relatively wide end section 37 (which may overlie one of the tube edge sections 18 or 20 in part) and relatively narrow transverse sections 38 spaced so that a major portion of the corresponding outer surface of tube 10 is uncovered and thus exposed to receive solar radiation. A third electrode 32 is provided on the inner surface of the tube. Electrode 32 takes the form of a single continuous layer which covers the entire expanse of the inner surface of the silicon body. The resulting structure is characterized by a substantially planar P-N junction (represented by the dotted line 22) that lies close to the outer surface of the cell and electrodes 32, 34 and 36 for coupling the unit into an electrical circuit. It comprises a unitary assembly of two solar cells connected in parallel with electrode 32 being common to both cells. Of course, if electrodes 34 and 36 were combined to form a single electrode, the unit would be a single solar cell with a pair of flat opposed energy collecting surfaces.

FIG. 7 shows a substantially, flat oval solar cell unit 43 formed in accordance with the present invention, mounted in a light collector or concentrator indicated generally at 44. Concentrator 44 comprises a parabolic reflector in the form of a trough-like member 45 of light reflective material having a solar cell support member 46 which extends lengthwise of the trough symmetrical with the center of optic axis 48. The side wall portions 50 and 52 of the concentrator are parabolas with foci at P, so that most of the radiant energy entering the concentrator is reflected (depending on the angle of incidence) onto the opposite radiation receiving side wall sections of the solar cell unit 43 therein. The substantially flat oval solar cell unit 43 is mounted on the top of support member 46 so that its substantially flat, relatively large radiation-receiving side wall sections are substantially equidistant from the center or optic axis 48. The combination of solar cell unit 43 and collector 44 serves to maximize the output of the solar cell unit under available solar radiation. Other forms of light concentrators also may be used in accordance with the teachings provided in *Proceedings of the First ERDA Semiannual Solar Photovoltaic Conversion Program Program Conference*, (July 22–25, 1975) JPL Document 5040-13. See also R. Winston, Solar Energy, Vol. 17, No. 4, 1975 "Principles of Cylindrical Concentrators for Solar Energy".

One significant advantage of the present invention which results from the provision of the substantially flat tubular structure is that the resulting solar cells may be readily cooled on the inside by circulation of an appropriate cooling medium, e.g. air on a liquid, in known manner.

Another significant advantage of the present invention is that the energy collecting sections of the solar cell unit, i.e., the substantially flat, relatively large side substrate wall sections 14 and 16, are substantially free of crystal edge defects. Eliminating such edge defects enhances the overall conversion efficiency of the solar cell unit. A further advantage results from the fact that tubular bodies may be grown by the EFG techniques at a pulling rate substantially the same as the pulling rate for flat ribbons, with the result that the productivity of solar cell manufacture in accordance with the present invention is almost double (in terms of total energy-collecting surface area) that of ribbons of the same width produced under similar conditions. And the growth of tubular bodies by the EFG process is easier than the growth of ribbon-shaped members.

Obviously, the invention may be practiced by using N-type silicon tubes and introducing a P-type layer or zone to the tube so as to form the required P-N junction. Also the tubes and solar cells may be made of some other material beside silicon.

Still other modifications and advantages will be obvious to one skilled in the art. For example, it is contemplated that the electrodes could be formed on the silicon tubes by evaporation deposition techniques and may comprise a layer of aluminum attached to the silicon body and a layer of silver bonded to the aluminum layer. Other electrode materials also may be used, and the electrodes may be formed by other techniques known to persons skilled in the art.

It is to be understood also that relatively large side wall sections 14 and 16 need not be exactly flat; however, where sections 14 and 16 are curved, the curvature must be sufficiently gentle for the tube to be useful for its intended purposes. By way of example, the tube can have a generally lenticular shape, e.g. as shown at 54 in FIG. 8. Accordingly, the term "flat oval" is to be construed as embracing a generally rectangular shape with rounded rather than sharp corners and also flattened elliptical shapes, i.e. ellipses characterized by a relatively short vertical axis and a relatively long horizontal axis and ellipses where portions thereof on opposite sides of the longer axis are flat or nearly so. Similarly the term "substantially flat" as applied to the side wall sections of the hollow tube or a surface thereof is to be construed as including a gently curved as well as a flat section or surface.

It is to be understood also that the term "substantially monocrystalline" as used herein is intended to embrace a crystalline body that is comprised of a single crystal or two or more crystals, e.g. a bicrystal or tricrystal, growing together longitudinally but separated by a relatively small angle (i.e. less than about 4°) grain boundary.

What is claimed is:

1. A solar cell unit comprising in combination:
   a substantially monocrystalline semi-conductor body in the form of a substantially flat oval tube having first and second opposed and mutually spaced flat side wall sections connected together by a pair of opposed edge sections, said side wall sections being substantially larger than said edge sections;
   said tube having a radiation-receiving outer surface and a photo-voltaic junction which is close to said outer surface and is capable of responding to radiant energy passing through said surface, said outer surface being substantially flat along the length and breadth of said side wall sections; and
   at least first, second and third electrodes for coupling said unit to an external circuit;
   said first and third electrodes (1) being carried on said first and second flat side wall sections, respectively, of said radiation receiving outer surface, and (2) each comprising a plurality of spaced conductors, and said second electrode being carried by an inner surface of said body.

2. A solar cell unit according to claim 1 wherein said first electrode is wrapped part way around one of said edge sections and said third electrode is wrapped part way around the other of said edge sections.

3. A solar cell unit according to claim 1 in combination with a trough-like solar energy concentrator having opposed side wall portions, said tube being disposed within and extending lengthwise of said concentrator with said side wall sections located on opposite sides of and substantially equidistant from the center axis of the concentrator, said side wall portions of said concentrator being reflectors shaped to reflect incident solar radiation onto the adjacent side wall sections of said tube.

4. A solar cell unit according to claim 1 wherein said tube is made of silicon.

5. A solar cell unit according to claim 1 wherein said tube comprises P-type silicon at said radiation-receiving surface.

6. A solar cell unit according to claim 1 wherein said tube comprises N-type silicon at said radiation-receiving surface.

7. A method of producing a solar cell unit comprising the steps of:
   a. providing a substantially monocrystalline body of a semiconductor material in the form of a flat oval tube having a pair of opposed mutually spaced flat side wall sections connected together by a pair of opposed edge sections, said side wall sections being substantially larger than said edge sections;
   b. forming a photo-voltaic junction near the outer surface of said tube along said side wall sections and said edge sections; and
   c. forming electrodes on the outer and inner surfaces of said side wall sections, with separate electrodes being formed on the outer surfaces of each of said flat side wall sections.

8. Method of claim 7 wherein said tube has an oxide layer at its outer and inner surfaces after said junction is formed, and further including the step of removing each oxide layer before formation of the electrodes.

9. Method of claim 7 wherein said photo-voltaic junction is a P-N junction.

10. Method of claim 9 further including the steps of forming a second P-N junction near the inner surface of said tube simultaneously with the formation of said first-mentioned P-N junction, and etching said tube to remove said second P-N junction before forming an electrode on an inner surface of said tube.

* * * * *